(12) United States Patent
Li

(10) Patent No.: US 9,899,534 B2
(45) Date of Patent: Feb. 20, 2018

(54) THIN-FILM TRANSISTOR AND METHOD FOR FORMING THE SAME

(71) Applicant: Shenzhen China Star Optoelectronics Technology Co., Ltd., Shenzhen, Guangdong (CN)

(72) Inventor: Jinming Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 179 days.

(21) Appl. No.: 14/892,650

(22) PCT Filed: Oct. 22, 2015

(86) PCT No.: PCT/CN2015/092566
§ 371 (c)(1),
(2) Date: Nov. 20, 2015

(87) PCT Pub. No.: WO2017/008410
PCT Pub. Date: Jan. 19, 2017

(65) Prior Publication Data
US 2017/0194500 A1    Jul. 6, 2017

(30) Foreign Application Priority Data
Jul. 14, 2015  (CN) .......................... 2015 1 0412290

(51) Int. Cl.
*H01L 29/786* (2006.01)
*H01L 21/467* (2006.01)
(Continued)

(52) U.S. Cl.
CPC ........ *H01L 29/7869* (2013.01); *H01L 21/467* (2013.01); *H01L 23/3171* (2013.01); *H01L 29/41733* (2013.01); *H01L 29/66742* (2013.01)

(58) Field of Classification Search
CPC ........ H01L 21/467; H01L 29/7869–29/78693; H01L 27/3274
See application file for complete search history.

(56) References Cited

U.S. PATENT DOCUMENTS

2012/0104384 A1\* 5/2012 Choi .................... H01L 27/1225
257/43
2013/0037807 A1\* 2/2013 Fukaya ............... H01L 27/1225
257/57
2017/0179262 A1\* 6/2017 Kang ................ H01L 29/66969

FOREIGN PATENT DOCUMENTS

CN          101859799 A       10/2010
CN          102646699 A        8/2012
(Continued)

OTHER PUBLICATIONS

Apr. 26, 2016—International Search Report and Written Opinion Appn PCT/CN2015/092566.

*Primary Examiner* — Evan Pert
*Assistant Examiner* — Changhyun Yi
(74) *Attorney, Agent, or Firm* — Andrew C. Cheng

(57) ABSTRACT

A TFT includes a substrate, a gate, a gate insulating layer, a semiconductor oxide layer, a source/drain layer, a passivation layer, and a transparent conducting layer arranged from bottom to top. An etching block layer is formed after the source/drain layer arranged on the semiconductor oxide layer is etched. A method for forming for the TFT includes: depositing and photo-etching a gate on a substrate; depositing a gate insulating layer on the gate; depositing and photo-etching a semiconductor oxide layer on the gate insulating layer; depositing and photo-etching a source/drain layer on the semiconductor oxide layer; etching the source/drain layer on the semiconductor oxide layer for forming an etching block layer; depositing a passivation layer on the source/drain layer and the semiconductor oxide layer;

(Continued)

depositing a transparent conducting layer on the passivation layer.

2 Claims, 2 Drawing Sheets

(51) Int. Cl.
*H01L 29/66* (2006.01)
*H01L 23/31* (2006.01)
*H01L 29/417* (2006.01)

(56) References Cited

FOREIGN PATENT DOCUMENTS

| CN | 203134811 U | 8/2013 |
| CN | 104952935 A | 9/2015 |

* cited by examiner

THIN-FILM TRANSISTOR AND METHOD FOR FORMING THE SAME

BACKGROUND OF THE INVENTION

1. Field of the Invention

The present invention relates to the field of production of wafers and the field of display technology, and more particularly, to a thin-film transistor (TFT) and a method for forming for the TFT.

2. Description of the Prior Art

With rapid development of technology, the monitor display technology applying to cellphones, flat panels, or computers improves and updates constantly. The flat panel display (FPD) technology representing liquid crystal displays (LCD) has developed and improved rapidly with the outbreak of the technology and the demand of the market since 1990s. Especially, thin film transistor liquid crystal displays (TFT-LCD) become the mainstream products in the FPD market because of the advantages of good performance, suitable for mass production, good automation, low raw costs, etc.

The TFT-LCD is one type of active array LCD. Each of the liquid crystal pixels on the monitor of this type is driven by the TFT arranged behind the pixels. The TFT influences response and color of the displays greatly. The TFT is an important component in such a type of displays.

The TFT, short for thin film transistor, comprises a TFT-etched back channel and a TFT-protected back channel. The TFT-etched back channel comprises a substrate, a gate, a gate insulating layer, a semiconductor layer, and a source/drain layer arranged the semiconductor layer and the gate insulating layer (a drain and a source) arranged from bottom and top. The source/drain layer is formed at the position corresponding to the semiconductor layer after the source/drain layer is deposited on the gate insulating layer and the semiconductor layer through wet-etching. The semiconductor layer is easily destroyed since strong acid and mixtures are used in the process of wet-etching.

As for the TFT components, the semiconductor layer is mostly fabricated from a-IGZO thin films. A-IGZO thin films have advantages of high carrier mobility, high stability, and good homogeneity and have a good prospect in application widely. However, it is reported that agents like water, oxygen, and light easily affects the TFT when contacting the a-IGZO thin films. That's why more and more technicians use the TFT-protected back channel and arrange a protection layer on the semiconductor layer. The main difference between the TFT-protected back channel and the TFT-etched back channel is that an etching block layer is arranged on the semiconductor layer. The etching block layer is used for protecting the semiconductor layer from being destroyed in the process of etching. But, it is necessary to add a process of fabricating the etching block layer, which affects production efficiency. Moreover, the performance of the semiconductor layer is easily affected because of the process of depositing the etching block layer on the semiconductor layer. Also, the size of the TFT expands while the designing space reduces because of the addition of the etching block layer.

A variety of TFTs are developed in the conventional technology. However, in order to improve the performance of the TFT, prolong the lifespan of the TFT, expand the designing space of the TFT array, and improve the method for forming for the TFT, it is necessary to propose a new TFT for resolving the problems occurring in the conventional technology and propose a method for forming for the new TFT.

SUMMARY OF THE INVENTION

An object of the present invention is to propose a new TFT and the method for forming for the new TFT for solving the problems that the etching block layer protects the semiconductor layer in the conventional technology.

Specifically, the present invention proposes two schemes.

Firstly, a TFT is proposed by the present invention. The TFT comprises a substrate, a gate, a gate insulating layer, a semiconductor oxide layer, a source/drain layer, a passivation layer, and a transparent conducting layer. These components of the TFT are arranged from bottom to top. An etching block layer is formed after the source/drain layer arranged on the semiconductor oxide layer is etched. The semiconductor oxide layer and the etching block layer are heated for activation and then form a semiconductor layer and an insulating layer, respectively.

Furthermore, the inner of the source/drain layer is concaved for forming an interface. The etching block layer is accommodated in the interface and connected to the source/drain layer. The thickness of the etching block layer is smaller than that of the source/drain layer. The passivation layer covers the etching block layer and the source/drain layer.

The source/drain layer is a layer used for forming the two electrodes, the source and the drain. The inner of the source/drain layer is etched, and a concaved interface is formed. The two sides of the interface are the source and the drain, respectively.

Furthermore, the substrate is a glass substrate.

Furthermore, the gate is fabricated from metallic material.

Optionally, the gate is one of Al, Mo, or Nd, or several of Al, Mo, and Nd.

Preferably, the gate is Al/Mo.

Furthermore, the thickness of the gate ranges from 2000 Å to 5500 Å. The range of the thickness comprises any concrete value in between such as 2000 Å, 2500 Å, 3000 Å, 3500 Å, 4000 Å, 4500 Å, or 5500 Å.

Furthermore, the gate insulating layer is a SiOx layer or a composite layer of SiNx and SiOx.

Preferably, the gate insulating layer is a composite layer of SiNx and SiOx.

Furthermore, the thickness of the gate insulating layer ranges from 1500 Å to 4000 Å. The range of the thickness comprises any concrete value in between such as 1500 Å, 1800 Å, 2000 Å, 2200 Å, 2500 Å, 3000 Å, 3300 Å, 3500 Å, 3800 Å, or 4000 Å.

Furthermore, the semiconductor oxide layer is a metallic oxide layer.

Optionally, the metallic oxide layer is a ZnO layer, an $In_2O_3$ layer, an IZO layer, or an IGZO layer. Or, the metallic oxide layer comprises some of the layers.

Preferably, the semiconductor oxide layer is an IGZO layer.

Furthermore, the thickness of the semiconductor oxide layer ranges from 400 Å to 1500 Å. The range of the thickness comprises any concrete value in between such as 400 Å, 500 Å, 700 Å, 900 Å, 1000 Å, 1200 Å, or 1500 Å.

Furthermore, the source/drain layer forms a composite layer comprising two layers. The bottom layer of the composite layer is a ZnO(Al) layer. The top layer of the composite layer is fabricated from metallic material.

Optionally, the metallic material for the top layer of the source/drain layer is one of Al, Mo, or Nd. Or, the metallic material for the top layer of the source/drain layer is a compound of some of Al, Mo, and Nd.

Preferably, the metallic material is Al/Mo.

Furthermore, the thickness of the bottom of the source/drain layer ranges from 300 Å to 1000 Å. The range of the thickness comprises any concrete value in between such as 300 Å, 400 Å, 500 Å, 600 Å, 700 Å, 800 Å, 900 Å, or 1000 Å. The thickness of the top of the source/drain layer ranges from 1000 Å to 6000 Å. The range of the thickness comprises any concrete value in between such as 1000 Å, 1500 Å, 2000 Å, 2500 Å, 3000 Å, 3500 Å, 4000 Å, 4500 Å, 5000 Å, 5500 Å, or 6000 Å.

Furthermore, the etching block layer is a ZnO(Al) layer.

Furthermore, the thickness of the etching block layer ranges from 50 Å to 500 Å. The range of the thickness comprises any concrete value in between such as 50 Å, 100 Å, 150 Å, 200 Å, 250 Å, 300 Å, 350 Å, 400 Å, 450 Å, or 500 Å.

Furthermore, the passivation layer is a SiOx layer or a composite layer of SiNx and SiOx.

Preferably, the passivation layer is a composite layer of SiNx and SiOx.

More preferably, the SiOx layer belonging to the passivation layer is the bottom layer contacting the etching block layer.

Furthermore, the thickness of the passivation layer ranges from 1500 Å to 4000 Å. The range of the thickness comprises any concrete value in between such as 1500 Å, 1800 Å, 2000 Å, 2200 Å, 2500 Å, 3000 Å, 3300 Å, 3500 Å, 3800 Å, or 4000 Å.

Furthermore, the transparent conducting layer is fabricated from one or some of ITO, nano silver lines, IMO, ATO, FTO, and ATO.

ITO refers to the doping system of $In_2O_3$:Sn; IMO refers to the doping system of $In_2O_3$:Mo; ATO refers to the doping system of $SnO_2$:Sb; FTO refers to the doping system of $SnO_2$:F; ZAO refers to the doping system of ZnO:Al.

Preferably, the transparent conducting layer is fabricated from ITO.

Furthermore, the thickness of the gate insulating layer ranges from 300 Å to 1000 Å. The range of the thickness comprises any concrete value in between such as 300 Å, 400 Å, 500 Å, 600 Å, 700 Å, 800 Å, 900 Å, or 1000 Å.

Secondly, the present invention proposes a method for forming for the TFT. The method comprises steps of:
depositing and photo-etching a gate on a substrate;
depositing a gate insulating layer on the gate;
depositing and photo-etching a semiconductor oxide layer on the gate insulating layer;
depositing and photo-etching a source/drain layer on the semiconductor oxide layer;
etching the source/drain layer on the semiconductor oxide layer for forming an etching block layer;
depositing a passivation layer on the source/drain layer and the semiconductor oxide layer;
depositing a transparent conducting layer on the passivation layer.

Furthermore, the substrate is a glass substrate.

Furthermore, the gate is deposited on the substrate by means of physical vapor deposition (PVD). Afterwards, the gate is patterned through the yellow process and the etching process.

Furthermore, the gate is fabricated from metallic material.

Optionally, the gate is one of Al, Mo, or Nd, or several of Al, Mo, and Nd.

Preferably, the gate is Al/Mo.

Furthermore, the thickness of the gate ranges from 2000 Å to 5500 Å. The range of the thickness comprises any concrete value in between such as 2000 Å, 2500 Å, 3000 Å, 3500 Å, 4000 Å, 4500 Å, or 5500 Å.

Furthermore, the gate insulating layer is deposited on the etched gate by means of plasma-enhanced chemical vapor deposition (PECVD).

Furthermore, the gate insulating layer is a SiOx layer or a composite layer of SiNx and SiOx.

Preferably, the gate insulating layer is a composite layer of SiNx and SiOx.

Furthermore, the thickness of the gate insulating layer ranges from 1500 Å to 4000 Å. The range of the thickness comprises any concrete value in between such as 1500 Å, 1800 Å, 2000 Å, 2200 Å, 2500 Å, 3000 Å, 3300 Å, 3500 Å, 3800 Å, or 4000 Å.

Furthermore, the semiconductor oxide layer is deposited on the gate insulating layer by means of PVD. Afterwards, the semiconductor oxide layer is patterned through the yellow process and the etching process.

Furthermore, the semiconductor oxide layer is a metallic oxide layer.

Optionally, the metallic oxide layer is a ZnO layer, an $In_2O_3$ layer, an IZO layer, or an IGZO layer. Or, the metallic oxide layer comprises some of the layers.

Preferably, the semiconductor oxide layer is an IGZO layer.

Furthermore, the thickness of the semiconductor oxide layer ranges from 400 Å to 1500 Å. The range of the thickness comprises any concrete value in between such as 400 Å, 500 Å, 700 Å, 900 Å, 1000 Å, 1200 Å, or 1500 Å.

Furthermore, the source/drain layer is deposited on the semiconductor oxide layer by means of PVD.

Furthermore, the bottom of the source/drain layer and then the top of the source/drain layer are deposited on the semiconductor oxide layer when the source/drain layer is deposited on the semiconductor oxide layer. The source/drain layer forms a composite layer comprising two layers.

Furthermore, the bottom layer of the composite layer is a ZnO(Al) layer. The top layer of the composite layer is fabricated from metallic material.

Optionally, the metallic material for the top layer of the source/drain layer is one of Al, Mo, or Nd. Or, the metallic material for the top layer of the source/drain layer is a compound of some of Al, Mo, and Nd.

Preferably, the metallic material is Al/Mo.

Furthermore, the thickness of the bottom of the source/drain layer ranges from 300 Å to 1000 Å. The range of the thickness comprises any concrete value in between such as 300 Å, 400 Å, 500 Å, 600 Å, 700 Å, 800 Å, 900 Å, or 1000 Å. The thickness of the top of the source/drain layer ranges from 1000 Å to 6000 Å. The range of the thickness comprises any concrete value in between such as 1000 Å, 1500 Å, 2000 Å, 2500 Å, 3000 Å, 3500 Å, 4000 Å, 4500 Å, 5000 Å, 5500 Å, or 6000 Å.

Furthermore, one portion of the source/drain layer arranged on the semiconductor oxide layer and the other portion of the source/drain layer undergo the yellow process and the etching process after the composite layer of the source/drain layer is deposited. Afterwards, the semiconductor oxide layer is patterned through the yellow process and the etching process. The portion of the source/drain layer arranged on the semiconductor oxide layer is etched for forming the etching block layer. The structure of the etching block layer is just like the structure of bottom layer of the source/drain layer.

Furthermore, the source/drain layer and the etching block layer are patterned using the grayscale mask technique when the source/drain layer is dealt with using the yellow process.

Furthermore, the etching block layer is a ZnO(Al) layer.

Furthermore, the thickness of the etching block layer ranges from 50 Å to 500 Å. The range of the thickness comprises any concrete value in between such as 50 Å, 100 Å, 150 Å, 200 Å, 250 Å, 300 Å, 350 Å, 400 Å, 450 Å, or 500 Å.

Furthermore, a method for increasing the content of oxygen in the etching block layer is ion infusion after the etch block layer is formed.

Furthermore, the semiconductor oxide layer and the etching block layer are heated for activation in an oven after the ions are infused. Thus, the activated semiconductor oxide layer becomes a semiconductor layer, and the activated etching block layer becomes an insulating layer.

Furthermore, the heating temperature in the activation process ranges from 250° C. to 450° C. The range of the temperature comprises any concrete value in between such as 250° C., 300° C., 350° C., 400° C., or 450° C. The duration in the activation process ranges from 20 minutes to 120 minutes. The range of the duration comprises any concrete value in between such as 20 minutes, 40 minutes, 60 minutes, 80 minutes, 100 minutes, or 120 minutes.

Furthermore, the passivation layer is deposited on the source/drain layer and the etching block layer by means of PVD. Afterwards, the passivation layer is patterned through the yellow process and the etching process.

Furthermore, the passivation layer is heated for activation and then patterned after the passivation layer is deposited.

Furthermore, the passivation layer is a SiOx layer or a composite layer of SiNx and SiOx.

Preferably, the passivation layer is a composite layer of SiNx and SiOx.

More preferably, the SiOx layer belonging to the passivation layer is the bottom layer contacting the etching block layer.

Furthermore, the thickness of the passivation layer ranges from 1500 Å to 4000 Å. The range of the thickness comprises any concrete value in between such as 1500 Å, 1800 Å, 2000 Å, 2200 Å, 2500 Å, 3000 Å, 3300 Å, 3500 Å, 3800 Å, or 4000 Å.

The transparent conducting layer is deposited on the passivation layer by means of PVD. Afterwards, the transparent conducting layer is patterned through the yellow process and the etching process.

The etched transparent conducting layer with patterns is a pixel electrode.

Furthermore, the transparent conducting layer is fabricated from one or some of ITO, nano silver lines, IMO, ATO, FTO, and ATO.

ITO refers to the doping system of $In_2O_3$:Sn; IMO refers to the doping system of $In_2O_3$:Mo; ATO refers to the doping system of $SnO_2$:Sb; FTO refers to the doping system of $SnO_2$:F; ZAO refers to the doping system of ZnO:Al.

Preferably, the transparent conducting layer is fabricated from ITO.

Furthermore, the thickness of the gate insulating layer ranges from 300 Å to 1000 Å. The range of the thickness comprises any concrete value in between such as 300 Å, 400 Å, 500 Å, 600 Å, 700 Å, 800 Å, 900 Å, or 1000 Å.

Compared with the conventional technology, the present invention provides following good effects:

In the present invention, the source/drain layer with the structure of a composite layer undergoes consecutive photo-etching, etching, ion infusion, and heating instead of depositing the etching block layer exclusively. The content of oxygen in the ZnO(Al) layer is adjusted for changing the conductivity of the etching block layer. In this way, the etching block layer can protect the semiconductor oxide layer and have excellent insulation actually. In other words, the etching block layer in the present invention is part of the source/drain layer. Such a structure is good for reducing the overall size of the TFT by reducing the thickness of the etching block layer so that larger room is available for designing the TFT and improving the structure of the TFT. On the other hand, thanks to the etching block layer with the practical functions, the influence of water, oxygen, and energy on the semiconductor oxide layer is greatly reduced. So the performance of the TFT maintains well.

DETAILED DESCRIPTION OF THE PREFERRED EMBODIMENTS

Figure 1:
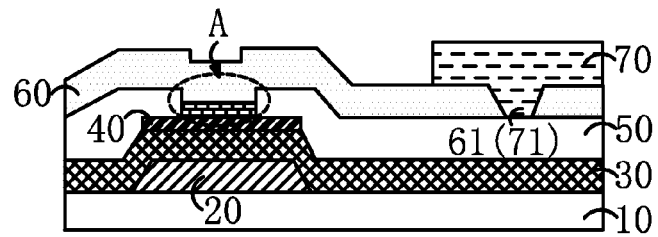
FIG. 1 shows a thin film transistor according to a first embodiment of the present invention.

The accompanying drawings are included to provide a further understanding of the invention, and are incorporated in and constitute a part of this specification. The drawings illustrate embodiments of the invention and, together with the description, serve to explain the principles of the invention.

Embodiment 1

A TFT is proposed by this embodiment. Please refer to FIG. 1. The TFT comprises a substrate 10, a gate 20, a gate insulating layer 30, a semiconductor oxide layer 40, a source/drain layer 50, a passivation layer 60, and a transparent conducting layer 70 arranged from bottom to top.

Specifically, the substrate 10 is a glass substrate. A gate 20 is deposited on the substrate 10. The length of the gate 20 (the length along the left-right direction in FIG. 1) is smaller than that of the substrate 10. The gate 20 is fabricated from Al/Mo. The thickness of the gate 20 is 3000 Å. The gate insulating layer 30 encloses the gate 20 and contacts the lateral sides and top side of the gate 20. The gate insulating layer 30 covers the substrate 10 and the gate 20. The gate insulating layer 30 is a composite layer of SiNx and SiOx. The thickness of the gate insulating layer 30 is 3000 Å. The semiconductor oxide layer 40 is arranged on the gate insulating layer 30. The length of the semiconductor oxide layer 40 (the length along the left-right direction in FIG. 1) is smaller than that of the gate insulating layer 30. The semiconductor oxide layer 40 is an IGZO layer. The thickness of the semiconductor oxide layer 40 is 1000 Å.

Figure 2:
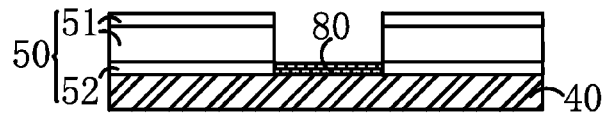
FIG. 2 shows a structure of area A of FIG. 1, where a passivation layer is omitted.

The source/drain layer 50 encloses the semiconductor oxide layer 40, contacts the lateral sides and top side of the semiconductor oxide layer 40, and covers the gate insulating layer 30 and the semiconductor oxide layer 40. The source/drain layer 50 is a composite layer. Please refer to FIG. 2. The source/drain layer 50 comprises a top layer 51 and a bottom layer 52. The bottom layer 52 is a ZnO(Al) layer. The thickness of the bottom layer 52 is 500 Å. The top layer 51 is an Al/Mo layer. The Mo layer is arranged on the Al layer. The thickness of the Al/Mo layer is 3000 Å. The inner of the source/drain layer 50 arranged on the semiconductor oxide layer 40 is concaved for forming an interface (the downward direction as shown in FIG. 2). The etching block layer 80 is accommodated in the interface. The etching block layer 80 is formed after the top layer 51 is etched near the source/drain layer 50 on the semiconductor oxide layer 40 except for the bottom layer 52. The etching block layer 80 is a ZnO(Al) layer. The length of the etching block layer 80 is smaller than that of the semiconductor oxide layer 40 (i.e., the length along a right and left direction as shown in FIG. 1). The length of the etching block layer 80 is 300 Å. While the etching block layer 80 is formed because the source/drain layer 50 is etched, the inner of the source/drain layer 50 forms a concaved interface. The source/drain layer 50 arranged on both sides of the etching block layer 80 forms a source and a drain. The source and the drain correspond to each other. It is notified that after the IGZO layer used as the semiconductor oxide layer 40 is heated for activation, the semiconductor oxide layer 40 is turned into a semiconductor layer. Besides, after oxygen is added to the ZnO(Al) layer used as the etching block layer 80 which is heated for activation, the etching block layer 80 is turned into an insulating layer with larger resistance and better insulation.

The passivation layer 60 covers the source/drain layer 50 and the etching block layer 80. The passivation layer 60 is a composite layer of SiNx and SiOx. The thickness of the passivation layer 60 is 3000 Å. The SiOx layer is used as the bottom layer of the passivation layer 60 and contacts the etching block layer 80. Since the SiOx layer comprises a larger amount of oxygen, it ensures that the effect of insulation of the etching block layer 80 is improved. In addition, a contact hole 61 is arranged on the passivation layer 60. The contact hole 61 is used for fitting the transparent conducting layer 70. The contact hole 61 is concaved inside the passivation layer 60. The thickness of the contact hole 61 is the same as that of the passivation layer 60. In other words, the contact hole 61 penetrates the passivation layer 60 along a vertical direction. The transparent conducting layer 70 is used for electrically connected to the TFT and a storage capacitor (not shown). A portion of the transparent conducting layer 70 connected to the TFT is roughly arranged on the passivation layer 60. The location of the portion just staggers the semiconductor oxide layer 40, the etching block layer 80, and the gate 20. An edge of the lower surface of the transparent conducting layer 70 protrudes downwards for forming a bump 71. The bump 71 is just accommodated in the contact hole 61 of the passivation layer 60. The transparent conducting layer 70 is connected to the source/drain layer 50 successfully. The transparent conducting layer 70 is an ITO layer. The thickness of the transparent conducting layer 70 is 500 Å.

Embodiment 2

A method for forming a TFT is proposed by this embodiment.

Figure 3:
FIG. 3 illustrates a first step of the method for forming the TFT according to a second embodiment of the present invention.

Please refer to FIG. 3. A glass substrate 10 is prepared. Then, a gate 20 is deposited on the glass substrate 10 by means of physical vapor deposition (PVD). Afterwards, the gate 20 is patterned through the yellow process and the etching process. The gate 20 is fabricated from Al/Mo. The thickness of the gate 20 is 3000 Å. The length of the gate 20 is smaller than that of the glass substrate 10.

Figure 4:
FIG. 4 illustrates a second step of the method for forming the TFT according to the second embodiment of the present invention.

Please refer to FIG. 4. A gate insulating layer 30 is deposited on the etched gate 20 by means of plasma-enhanced chemical vapor deposition (PECVD). The gate insulating layer 30 encloses the gate 20 and contacts the lateral sides and top side of the gate 20. The gate insulating layer 30 covers the substrate 10 and the gate 20. The gate insulating layer 30 is a composite layer of SiNx and SiOx. The thickness of the gate insulating layer 30 is 3000 Å.

Figure 5:
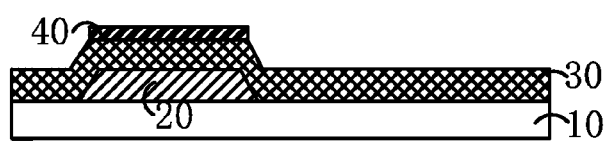
FIG. 5 illustrates a third step of the method for forming the TFT according to the second embodiment of the present invention.

Please refer to FIG. 5. The semiconductor oxide layer 40 is deposited on the gate insulating layer 30 by means of PVD. Afterwards, the semiconductor oxide layer 40 is patterned through the yellow process and the etching process. The semiconductor oxide layer 40. The semiconductor oxide layer 40 is an IGZO layer. The thickness of the semiconductor oxide layer 40 is 1000 Å. The length of the semiconductor oxide layer 40 is the same as the length of the top face of the gate insulating layer.

Figure 6:
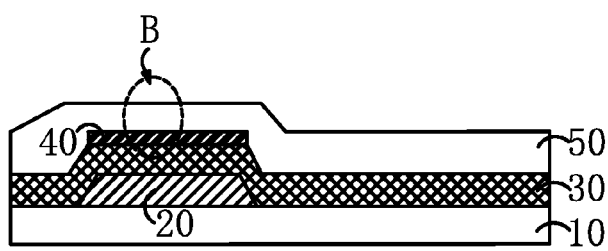
FIG. 6 illustrates a fourth step of the method for forming the TFT according to the second embodiment of the present invention.
Figure 7:
FIG. 7 shows a structure of area B of FIG. 6.

Please refer to FIG. 6. The source/drain layer 50 is deposited on the etched semiconductor oxide layer 40 by means of PVD. The source/drain layer 50 encloses the semiconductor oxide layer 40 and contacts the lateral sides and top side of the semiconductor oxide layer 40. The source/drain layer 50 covers the gate insulating layer 30 and the semiconductor oxide layer 40. Please refer to FIG. 7. The bottom layer 52 of the source/drain layer 50 is deposited on the semiconductor oxide layer 40, and then the top layer 51 of the source/drain layer 50 is deposited on the semiconductor oxide layer 40. The source/drain layer 50 forms a composite layer with two layers. The bottom layer 52 is a ZnO(Al) layer. The thickness of the bottom layer 52 is 500 Å. The top layer 51 is an Al/Mo layer. The thickness of the top layer 51 is 3000 Å.

Figure 8:
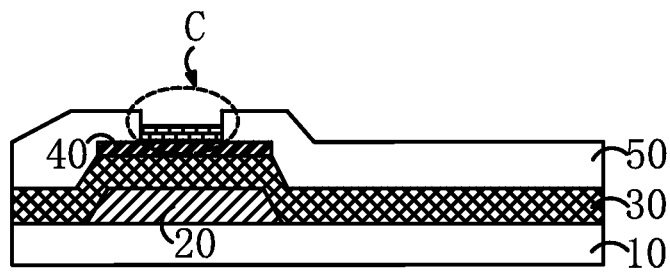
FIG. 8 illustrates a fifth step of the method for forming the TFT according to a second embodiment of the present invention.
Figure 9:
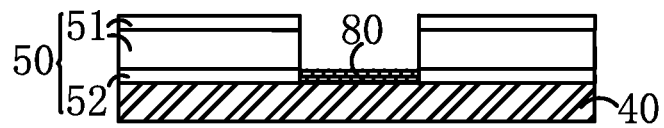
FIG. 9 shows a structure of area C of FIG. 8.

Please refer to FIG. 8 and FIG. 9. A portion of the source/drain layer 50 arranged on the semiconductor oxide layer 40 and the other portions of the source/drain layer 50 are processed through a grayscale mask and an etching. The portion of the source/drain layer 50 arranged on the semiconductor oxide layer 40 is finally etched to be the etching block layer 80. The other portions of the source/drain layer 50 are finally etched to be the source/drain layer 50 with a pattern. Specifically, the top layer 51 of the source/drain layer 50 is completely etched except for the bottom layer 52 when the source/drain layer 50 arranged on the semiconductor oxide layer 40 is etched. The etching block layer 80 is formed. Both of the etching block layer 80 and the source/drain layer 50 are ZnO(Al) layers. The thickness of the etching block layer 80 is 300 Å. The length of the etching block layer 80 is smaller than that of the semiconductor oxide layer 40. In addition, the inner of the source/drain layer 50 is etched, and a concaved interface is formed while the etching block layer 80 is formed from the etched source/drain layer 50. Two sides of the etching block layer 80 are a source and a drain, respectively.

To improve the performance and lifespan of the fabricated TFT, the related structure of the TFT is modified in this embodiment. The method of ion infusion is used to infuse oxygen ion to the etching block layer 80 for increasing the oxygen in the ZnO(Al) layer after the etching block layer 80 is formed with etching. Afterwards, the semiconductor oxide layer 40 and the etching block layer 80 are heated in the oven. The semiconductor oxide layer 40 is activated and forms a semiconductor layer. The etching block layer 80 is activated and forms an insulating layer. The temperature for heating the layers is 300° C. The duration for activating the layers is 60 minutes. Also, the layers are activated with air or oxygen.

It is understood that the conductivity of a ZnO(Al) thin film varies with the content of oxygen. A prepared ZnO(Al) thin film without oxygen has the best conductivity. The thin film has better transparency (>85%). Also, the resistance is better. When some oxygen is added to working air, the probability of reaction of oxygen and zinc particles increases. As a result, vacancy concentration of oxygen in the ZnO(Al) thin film decreases while the resistance increases. On the other hand, aluminum atoms in the ZnO(Al) thin film reacts with oxygen, and $Al_2O_3$ is generated. As a result, substituted $Al^{3+}$ in the thin film decreases while the density of conducting electrons decreases. Moreover, the generated $Al_2O_3$ is secluded from the grain boundary. The scatter of a charge carrier increases. The electron mobility decreases as well. Also, the resistance increases. The method of ion infusion is used to infuse oxygen ion to the ZnO(Al) layer for increasing the oxygen in the ZnO(Al) layer in this embodiment. Also, with the method of heating for activation, the content of oxygen increases in the ZnO(Al) layer. The ZnO(Al) layer is turned into the insulating layer.

Figure 10:
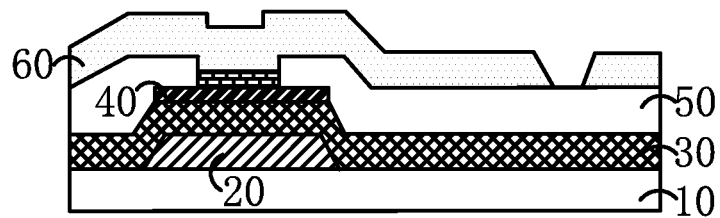
FIG. 10 illustrates a sixth step of the method for forming the TFT according to the second embodiment of the present invention.

Please refer to FIG. 10. After the etching block layer 80 is activated, a passivation layer 60 is deposited on the source/drain layer 50 and the etching block layer 80 by means of PVD, the passivation layer 60 is activated with a high temperature, and then the passivation layer 60 is patterned through the yellow process and the etching process. Specifically, the passivation layer is a composite layer of SiNx and SiOx. The thickness of the passivation layer 60 is 3000 Å. The SiOx layer is the bottom layer of the passivation layer 60 and contacts the etching block layer 80. The reason why the SiOx layer is used as the bottom layer of the passivation layer 60 in this embodiment is that the SiOx layer comprises a larger amount of oxygen. Once the deposited the passivation layer 60 is activated, the amount of oxygen increases in the ZnO(Al) layer which is the contact area of the SiOx layer and the passivation layer 60. The ZnO(Al) layer ensures to be insulated thoroughly.

Figure 11:
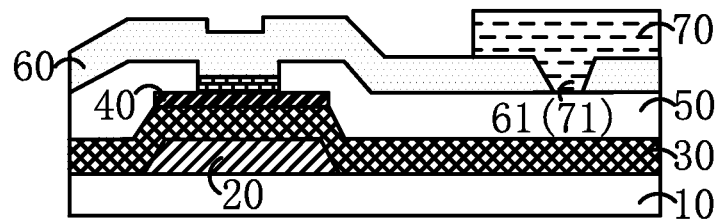
FIG. 11 illustrates a seventh step of the method for forming the TFT according to the second embodiment of the present invention.

Please refer to FIG. 11. After the passivation layer 60 is etched, a transparent conducting layer 70 is deposited on the passivation layer 60 by means of PVD, and then the transparent conducting layer 70 is patterned through the yellow process and the etching process. Specifically, a contact hole 61 is arranged on the passivation layer 60. The contact hole 61 is used for fitting the transparent conducting layer 70. The contact hole 61 is concaved inside the passivation layer 60. The thickness of the contact hole 61 is the same as that of the passivation layer 60. In other words, the contact hole 61 penetrates the passivation layer 60. The transparent conducting layer 70 is used for electrically connected to the TFT and a storage capacitor (not shown). A portion of the transparent conducting layer 70 connected to the TFT is roughly arranged on the passivation layer 60. The location of the portion just staggers the semiconductor oxide layer 40, the etching block layer 80, the gate 20, etc. An edge of the lower surface of the transparent conducting layer 70 protrudes downwards for forming a bump 71. The bump 71 is just accommodated in the contact hole 61 of the passivation layer 60. The transparent conducting layer 70 is connected to the source/drain layer 50 successfully. The transparent conducting layer 70 is an ITO layer. The thickness of the transparent conducting layer 70 is 500 Å.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:
1. A method for forming a thin-film transistor (TFT), comprising:
   depositing and photo-etching a gate on a substrate;
   depositing a gate insulating layer on the gate;
   depositing and photo-etching a semiconductor oxide layer on the gate insulating layer;
   depositing and photo-etching a source/drain layer on the semiconductor oxide layer;
   etching the source/drain layer on the semiconductor oxide layer for forming an etching block layer;
   depositing a passivation layer on the source/drain layer and the semiconductor oxide layer;
   depositing a transparent conducting layer on the passivation layer,
   wherein a bottom of the source/drain layer and then a top of the source/drain layer are deposited on the semiconductor oxide layer when the source/drain layer is deposited on the semiconductor oxide layer, and the source/drain layer forms a composite layer comprising two layers,
   wherein one portion of the source/drain layer arranged on the semiconductor oxide layer and the other portion of the source/drain layer undergo a yellow process and an etching process after the composite layer of the source/drain layer is deposited wherein the portion of the source/drain layer arranged on the semiconductor oxide layer is etched for forming the etching block layer, and a structure of the etching block layer is a bottom layer structure of the source/drain layer,
   wherein ions are infused for increasing a content of oxygen in the etching block layer after the etching block layer is formed.
2. The method of claim 1, wherein heat and activate the semiconductor oxide layer and the etching block layer in an oven after the ions are infused so that the semiconductor oxide layer is activated to be a semiconductor layer, and the etching block layer is activated to be an insulating layer.

* * * * *